United States Patent
Kitada et al.

(10) Patent No.: US 8,228,247 B2
(45) Date of Patent: Jul. 24, 2012

(54) ANTENNA-CHARACTERISTIC MEASURING APPARATUS AND ANTENNA-CHARACTERISTIC MEASURING METHOD

(75) Inventors: Hiroshi Kitada, Yokohama (JP); Yukio Yamamoto, Sagamihara (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 435 days.

(21) Appl. No.: 12/411,039

(22) Filed: Mar. 25, 2009

(65) Prior Publication Data

US 2009/0219217 A1 Sep. 3, 2009

Related U.S. Application Data

(63) Continuation of application No. PCT/JP2007/065906, filed on Aug. 15, 2007.

(30) Foreign Application Priority Data

Sep. 28, 2006 (JP) ................................. 2006-264899

(51) Int. Cl.
*G01R 29/10* (2006.01)
(52) U.S. Cl. ...................................................... 343/703
(58) Field of Classification Search .................. 343/703; 342/359, 360; 455/67.11, 67.12, 67.14
See application file for complete search history.

(56) References Cited

U.S. PATENT DOCUMENTS

| | | | | |
|---|---|---|---|---|
| 4,906,998 A * | 3/1990 | Shibuya | ............................. | 342/4 |
| 5,530,412 A * | 6/1996 | Goldblum | .................... | 333/232 |
| 5,532,704 A * | 7/1996 | Ruelle | ............................ | 343/703 |
| 6,541,984 B2 * | 4/2003 | Kobuchi et al. | ................ | 324/637 |
| 6,914,571 B1 * | 7/2005 | Lemanczyk et al. | .......... | 343/703 |
| 7,161,357 B2 * | 1/2007 | Lee et al. | ....................... | 324/600 |
| 7,286,961 B2 * | 10/2007 | Kildal | ............................ | 702/182 |
| 7,444,264 B2 * | 10/2008 | Kildal | ............................ | 702/182 |
| 7,477,877 B2 * | 1/2009 | Bednasz et al. | ............. | 455/67.14 |
| 7,904,126 B2 * | 3/2011 | Kim et al. | ................... | 455/575.4 |
| 2002/0160717 A1* | 10/2002 | Persson et al. | ............... | 455/67.1 |
| 2006/0055592 A1* | 3/2006 | Leather et al. | ................ | 342/174 |
| 2008/0056340 A1* | 3/2008 | Foegelle | ....................... | 375/224 |
| 2009/0140750 A1* | 6/2009 | Sugiura et al. | ................ | 324/627 |

FOREIGN PATENT DOCUMENTS

| | | |
|---|---|---|
| JP | 62-266902 | 11/1987 |
| JP | 2000-214201 | 8/2000 |
| JP | 2003-75489 | 3/2003 |
| JP | 2004-354362 | 12/2004 |

OTHER PUBLICATIONS

Written Opinion with English language translation of International Application No. PCT/JP2007/065906.

* cited by examiner

*Primary Examiner* — Michael C Wimer
(74) *Attorney, Agent, or Firm* — Keating & Bennett, LLP

(57) ABSTRACT

A measured antenna and a measuring antenna are placed inside a radio anechoic container. On the basis of an aperture size D of the measured antenna, an aperture size d of the measuring antenna, and a wavelength λ of a measurement frequency, a distance L between the measured antenna and the measuring antenna is set to a value in the range of $(D+d)^2/(2\lambda)$ to $2(D+d)^2/\lambda$. Thus, in the Fresnel region where the distance L is short, antenna characteristics of the measured antenna substantially the same as those in the Fraunhofer region where the distance L is long can be measured.

10 Claims, 3 Drawing Sheets

ANTENNA-CHARACTERISTIC MEASURING APPARATUS AND ANTENNA-CHARACTERISTIC MEASURING METHOD

CROSS-REFERENCE TO RELATED APPLICATIONS

This is a continuation under 35 U.S.C. §111(a) of PCT/JP2007/065906 filed Aug. 15, 2007, and claims priority of JP2006-264899 filed Sep. 28, 2006, both incorporated by reference.

BACKGROUND

1. Technical Field

The present invention relates to an antenna-characteristic measuring apparatus and an antenna-characteristic measuring method suitable for use in measuring antenna characteristics of small antennas for mobile phones and the like.

2. Background Art

A known measuring method for measuring antenna power of a wireless application using a radio anechoic container is disclosed in Patent Document 1. In the measuring method of Patent Document 1, a correction term of an equation for determining antenna power is introduced by using a site factor of a first radio anechoic container to be actually used in measurement; namely, a difference between the site attenuation of the first radio anechoic container and the site attenuation of a second radio anechoic container whose characteristics are known. Thus, in the conventional art, antenna power of a wireless application is easily measured using a small radio anechoic container.

Patent Document 1: Japanese Unexamined Patent Application Publication No. 2003-75489

In the measuring method of the conventional art, it is necessary to measure the site attenuation of a radio anechoic container in advance to identify a site factor. Here, the site attenuation is a value unique to each radio anechoic container. Therefore, when a new radio anechoic container is to be used, it is necessary to measure the site attenuation of the new radio anechoic container and thus, the new radio anechoic container cannot be immediately used. Also in the conventional art, since arithmetic processing needs to be performed on a correction term after actual measurement, it is not necessarily easy to perform measurement of antenna characteristics.

SUMMARY

The disclosed apparatus and method address the problems of the conventional art described above. Disclosed herein are an antenna-characteristic measuring apparatus and an antenna-characteristic measuring method that can measure antenna characteristics using a small radio anechoic container without performing arithmetic processing, such as correction.

To address the problems described above, an antenna-characteristic measuring apparatus may include a radio anechoic container internally provided with a radio wave absorber, for receiving a measured antenna placed inside the radio anechoic container and to be subjected to measurement, and a measuring antenna positioned inside the radio anechoic container and opposite the measured antenna and configured to measure antenna characteristics of the measured antenna. In the antenna-characteristic measuring apparatus, a distance L between the measured antenna and the measuring antenna is set to satisfy the following relationship:

$$\frac{(D+d)^2}{2\lambda} \le L \le \frac{2(D+d)^2}{\lambda}$$

where D denotes aperture size of the measured antenna, d denotes aperture size of the measuring antenna, and λ denotes wavelength of a measurement frequency.

Also disclosed is an antenna-characteristic measuring method in which a measured antenna and a measuring antenna facing each other may be placed inside a radio anechoic container internally provided with a radio wave absorber, and the measuring antenna is used to measure antenna characteristics of the measured antenna. The antenna-characteristic measuring method includes the steps of setting a distance L between the measured antenna and the measuring antenna to satisfy the following relationship:

$$\frac{(D+d)^2}{2\lambda} \le L \le \frac{2(D+d)^2}{\lambda}$$

where D denotes aperture size of the measured antenna, d denotes aperture size of the measuring antenna, and λ denotes wavelength of a measurement frequency; and measuring, after the setting step, electromagnetic waves from the measured antenna using the measuring antenna.

With the configuration described above, in the Fresnel region where the distance between the measuring antenna and the measured antenna is small, antenna characteristics substantially the same as those in the Fraunhofer region where the distance between these antennas is large can be measured.

That is, in general, each of the aperture sizes D and d of each antenna is substantially the same as the wavelength λ of the measurement frequency. Therefore, when the relationship defined above is satisfied, each of the aperture sizes D and d tends to be smaller than the distance L. In this case, the radiation pattern of electromagnetic waves radiated from the measured antenna in the Fresnel region is substantially the same as that in the Fraunhofer region. Therefore, even in the Fresnel region where the distance L between the measured antenna and the measuring antenna is in the range of $(D+d)^2/(2\lambda)$ to $2(D+d)^2/\lambda$, antenna characteristics substantially the same as those in the Fraunhofer region where the distance L is greater than $2(D+d)^2/\lambda$ can be measured.

As a result, since antenna characteristics can be measured in the Fresnel region where the distance L between the measured antenna and the measuring antenna is smaller than that in the Fraunhofer region, the outer dimensions of the radio anechoic container can be reduced. Thus, the radio anechoic container can be made compact and the measurement space can be made small. Additionally, since there is no need to measure the attenuation of the radio anechoic container and no need to perform arithmetic processing, such as correction, it is possible to reduce measurement time and improve workability of measurement.

Other features and advantages will become apparent from the following description of embodiments of the apparatus and the method, which refers to the accompanying drawings.

DETAILED DESCRIPTION

Figure 1:
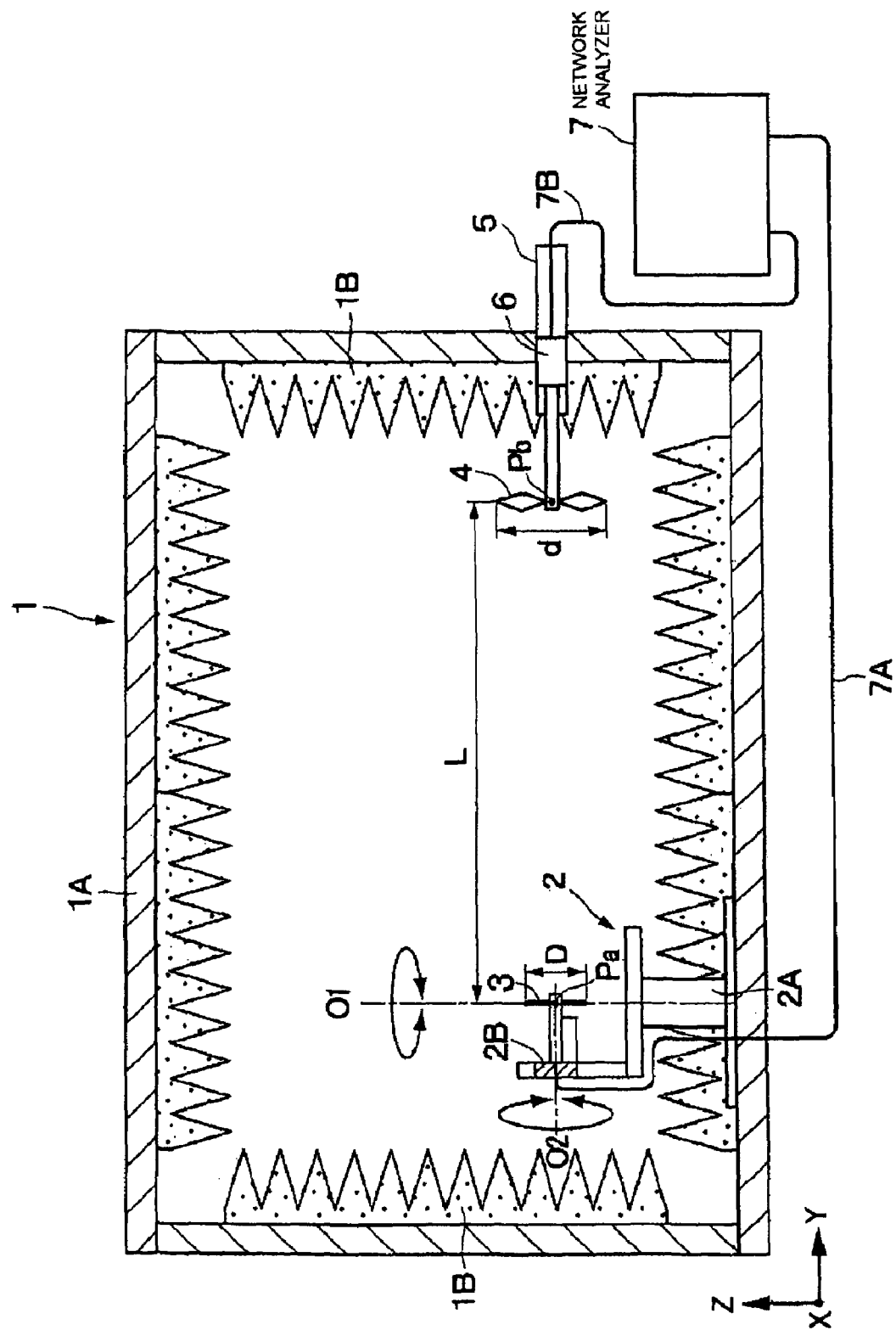
FIG. 1 is a front view of an antenna-characteristic measuring apparatus.
Figure 2:
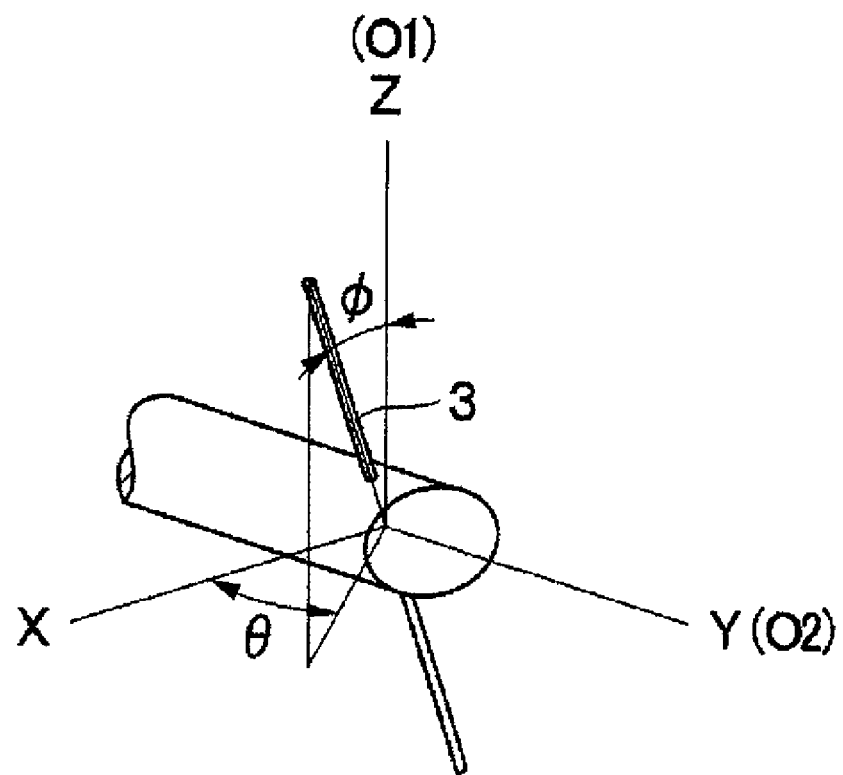
FIG. 2 is an enlarged perspective view of a measured antenna and its vicinity illustrated in FIG. 1.

Reference Numerals 1 radio anechoic container
1B radio wave absorber
3 measured antenna
4 measuring antenna Hereinafter, an antenna-characteristic measuring apparatus will be described in detail with reference to the attached drawings.

Referring to FIG. 1, a radio anechoic container 1 includes a housing 1A composed of, for example, aluminum plates with a thickness of about 1 to 2 mm and a radio wave absorber 1B inside the housing 1A. The radio anechoic container 1 has a length of, for example, about 50 to 100 cm in each of the width direction (X direction), length direction (Y direction), and height direction (Z direction). The radio anechoic container 1 blocks external electromagnetic waves and prevents reflection of internal electromagnetic waves.

A two-axis positioner 2 is disposed inside the radio anechoic container 1 and, for example, near the left wall. The two-axis positioner 2 includes a first rotator 2A rotatable about an axis O1 parallel to the height direction and a second rotator 2B disposed on the first rotator 2A and rotatable about an axis O2 parallel to the length (right-and-left) direction. A measured antenna 3 (described below) is attached to a tip of the second rotator 2B. Thus, the two-axis positioner 2 causes the measured antenna 3 to rotate about the two axes, the axes O1 and O2, orthogonal to each other, thereby determining the azimuth (direction) of the measured antenna 3.

The measured antenna 3 is attached to a tip of the second rotator 2B of the two-axis positioner 2. The first and second rotators 2A and 2B cause the measured antenna 3 to rotate about the two axes, the axes O1 and O2. The measured antenna 3 is an object whose antenna characteristics are to be measured. Examples of the measured antenna 3 include various antennas for RF devices such as mobile phones, mobile terminals, and the like. The measured antenna 3 has an aperture size D of, for example, about 1 to 20 cm.

If a whip antenna (e.g., quarter-wave antenna) for an RF device such as a mobile phone is used as the measured antenna 3, electromagnetic waves are radiated from the whip antenna and the entire mobile phone. Therefore, the whip antenna and the entire mobile phone are attached to the two-axis positioner 2. In this case, the aperture size D is assumed to be the overall length of the whip antenna and mobile phone.

Alternatively, if an internal antenna (e.g., chip antenna) for an RF device such as a mobile phone is used as the measured antenna 3, electromagnetic waves are radiated from the entire mobile phone. Therefore, the entire mobile phone is attached to the two-axis positioner 2. In this case, the aperture size D is assumed to be the overall length of the mobile phone.

A measuring antenna 4 is disposed inside the radio anechoic container 1 and, for example, near the right wall as shown in the drawing. The measuring antenna 4 is attached to an antenna positioner 5 and positioned opposite the measured antenna 3 in the length (horizontal) direction. Here, the measuring antenna 4 is a small biconical antenna with an element length of, for example, about 15 cm. Therefore, an aperture size d of the measuring antenna 4 is equivalent to the element length.

The antenna positioner 5 is disposed through the right wall of the radio anechoic container 1. The antenna positioner 5 is capable of moving forward and backward laterally along the axis O2. The measuring antenna 4 is attached to a tip of the antenna positioner 5. By moving the antenna positioner 5 forward and backward, a distance L between the measured antenna 3 and the measuring antenna 4 is set to a value satisfying the relationship of Expression 1 below.

$$\frac{(D+d)^2}{2\lambda} \le L \le \frac{2(D+d)^2}{\lambda} \qquad \text{[Expression 1]}$$

Here, the distance L indicates a distance between a rotation center Pa (position at which the axes O1 and O2 intersect) and a reference point Pb (center position of the biconical antenna). In Expression 1, $\lambda$ denotes wavelength of a signal (electromagnetic wave) at a measurement frequency. In Expression 1, the aperture sizes D and d, wavelength $\lambda$, and distance L are all in the same units (e.g., cm). The measuring antenna 4 is connected via an attenuator 6 to a network analyzer 7 (described below).

The network analyzer 7 is connected to the measured antenna 3 via a high-frequency cable 7A while connected to the measuring antenna 4 via a high-frequency cable 7B and the attenuator 6. The network analyzer 7 uses the measuring antenna 4 to receive electromagnetic waves transmitted from the measured antenna 3 and measures received power Pr. The network analyzer 7 repeats this measurement while gradually changing an azimuth angle $\theta$ and an elevation angle $\phi$ of the measured antenna 3 using the two-axis positioner 2. Thus, the network analyzer 7 measures the antenna characteristics, such as antenna radiation efficiency and the like, of the measured antenna 3.

The antenna-characteristic measuring apparatus according to the present embodiment is configured as described above. Next, a method for measuring antenna characteristics using the antenna-characteristic measuring apparatus will be described.

In the first step, the measured antenna 3 is attached to the two-axis positioner 2, which is then placed inside the radio anechoic container 1.

In the second step, a measurement distance between the measured antenna 3 and the measuring antenna 4 is calculated on the basis of Expression 2 below:

$$L\min = \frac{(D+d)^2}{2\lambda} \qquad \text{[Expression 2]}$$

where Lmin denotes shortest distance satisfying the relationship of Expression 1.

In the third step, the distance L between the rotation center Pa of the two-axis positioner 2 and the reference point Pb of the small biconical antenna is adjusted to be equal to the shortest distance Lmin or to be within about 10% (e.g., several cm) of the shortest distance Lmin and slightly greater than the shortest distance Lmin. Specifically, after the antenna positioner 5 is moved in the length direction until the distance L matches a desired value, the measuring antenna 4 is positioned at a fixed point.

In the fourth step, the first and second rotators 2A and 2B of the two-axis positioner 2 are operated such that the measured antenna 3 is fixed at a position where both the azimuth angle $\theta$ and the elevation angle $\phi$ are 0°. Then, the network analyzer 7 uses the measuring antenna 4 to receive electromagnetic waves transmitted from the measured antenna 3 and measures the received power Pr(0°,0°). Upon completion of the measurement of the received power Pr(θ,φ) at one position of the measured antenna 3, the first rotator 2A of the two-axis positioner 2 is operated to increase the azimuth angle θ of the measured antenna 3 by 10°, and then, the received power Pr(10°,0°) is measured. This operation is repeated while the azimuth angle θ is in the range of 0° to 360°.

After the measured antenna 3 is rotated once in the direction of the azimuth angle θ, the second rotator 2B of the two-axis positioner 2 is operated to increase the elevation angle φ of the measured antenna 3 by 10°. In this state, the received power Pr(θ,φ) is measured while the azimuth angle θ is changed in 10° steps in the range of 0° to 360° again. The above-described operation is repeated while the azimuth angle θ is in the range of 0° to 360° and the elevation angle φ is in the range of 0° to 1800 and thus, the received power Pr(θ,φ) at the azimuth angle θ and elevation angle φ is measured.

Last, in the fifth step, the received power Pr(θ,φ) is spherically integrated with respect to the entire space, and radiated power Prad from the measured antenna 3 is calculated on the basis of Expression 3 below:

$$Prad = \int_0^\pi \int_0^{2\pi} Ut(\theta, \phi) \sin\theta \, d\theta \, d\phi \quad \text{[Expression 3]}$$
$$= \frac{4\pi L^2}{\lambda^2 Gar} \int_0^\pi \int_0^{2\pi} Pr(\theta, \phi) \sin\theta \, d\theta \, d\phi$$

where Ut(θ,φ) denotes radiation intensity per unit solid angle, and Gar denotes absolute gain of the measuring antenna 4. In practice, the received power Pr (θ,φ) is measured every 10° of the azimuth angle θ and elevation angle φ. Therefore, discrete integration, instead of the continuous integration shown in Expression 3, is used.

As shown in Expression 4 below, the radiated power Prad of the measured antenna 3 calculated by Expression 3 is divided by input power Pin input to the measured antenna 3. Thus, antenna radiation efficiency ηt (antenna characteristic) of the measured antenna 3 is determined.

$$\eta t = \frac{Prad}{Pin} \quad \text{[Expression 4]}$$

Next, the distance L between the measured antenna 3 and the measuring antenna 4 will be discussed.

First, in the case of the present embodiment, an antenna characteristic (antenna radiation efficiency ηt) in the Fresnel region is measured. Here, the distance L is set to a value L1 satisfying the relationship of Expression 1. The measuring method described above is used to measure the antenna radiation efficiency ηt.

An internal antenna for a mobile phone is used as the measured antenna 3. Therefore, the aperture size D of the measured antenna 3 is assumed to be 18 cm, which is the overall length of the mobile phone. The aperture size d of the measuring antenna 4 is 15 cm, which is the element length of a small biconical antenna. A plurality of frequencies in the range of 1.7 to 2.0 GHz are used as measurement frequencies for the measurement.

The shortest distance Lmin satisfying the relationship of Expression 1 depends on the measurement frequency (wavelength λ). That is, as the measurement frequency becomes higher, the shortest distance Lmin becomes longer. Therefore, if the shortest distance Lmin is determined for a signal having a frequency higher than all measurement frequencies and the distance L is set to this shortest distance Lmin, the distance L (L1) satisfies the relationship of Expression 1 for all measurement frequencies.

In the present embodiment, for a signal having a frequency of 2.17 GHz (wavelength λ is 13.8 cm) higher than all measurement frequencies, the shortest distance Lmin is about 39.5 cm. Therefore, in the present embodiment, the distance L1 between the measured antenna 3 and the measuring antenna 4 is set to 40 cm. Thus, the distance L1 satisfies the relationship of Expression 1 for all measurement frequencies (1.7 to 2.0 GHz).

Next, as a comparative example, an antenna characteristic (antenna radiation efficiency ηt') in the Fraunhofer region (far field) is measured. Here, the distance L is set to a value L2 greater than values satisfying the relationship of Expression 1. The measuring method described above is used to measure the antenna radiation efficiency ηt'.

The measured antenna 3 and the measuring antenna 4 used in the comparative example are the same as those used in the present embodiment. That is, in the comparative example, the values (aperture sizes D and d, wavelength λ) other than the value L2 are the same as those in the present embodiment.

The distance L is set to the value L2 greater than values satisfying the relationship of Expression 1. Here, a longest distance Lmax satisfying the relationship of Expression 1 depends on the measurement frequency (wavelength λ). That is, as the measurement frequency becomes higher, the longest distance Lmax becomes longer. Therefore, if the longest distance Lmax is determined for a signal having a frequency higher than all measurement frequencies and the distance L is set to this longest distance Lmax, the distance L is greater than values satisfying the relationship of Expression 1 for all measurement frequencies.

In the present embodiment described above, for a signal having a frequency of 2.17 GHz (wavelength λ is 13.8 cm) higher than all measurement frequencies, the longest distance Lmax is about 157 cm. Therefore, in the comparative example, the distance L2 between the measured antenna 3 and the measuring antenna 4 is set to 170 cm. Thus, the distance L2 is greater than values satisfying the relationship of Expression 1 for all measurement frequencies (1.7 to 2.0 GHz).

Figure 3:
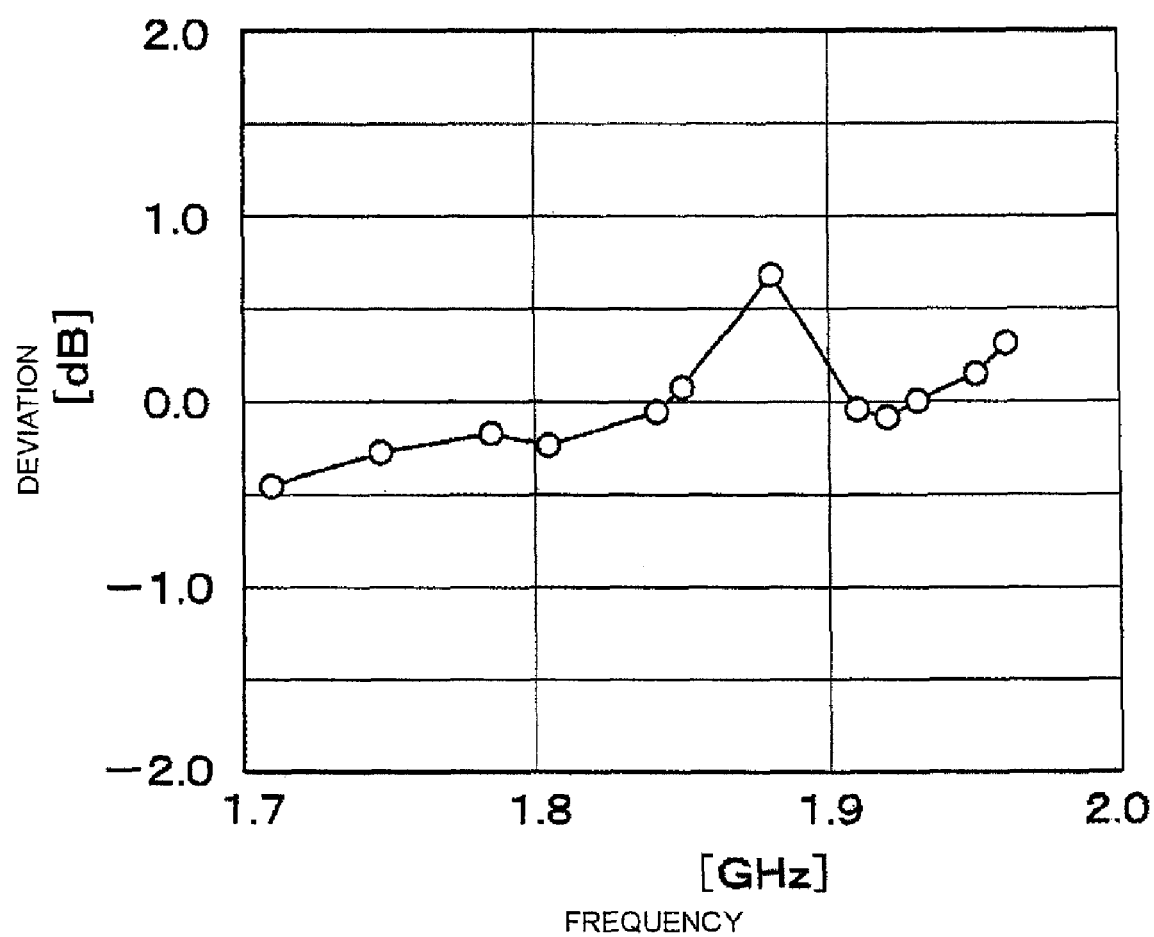
FIG. 3 is a characteristic diagram showing a deviation between antenna radiation efficiency according to the embodiment and that according to a comparative example.

Under the conditions described above, a deviation between measurement results of the two cases (present embodiment and comparative example) described above is examined and shown in FIG. 3. The graph of FIG. 3 shows that the deviation between the two cases is in the range of ±1.0 dB. Therefore, as in the case of the present embodiment, even if the distance L between the measured antenna 3 and the measuring antenna 4 is set to a value satisfying the relationship of Expression 1, a measurement result substantially the same as that in the far field where the distance L is longer than values satisfying the relationship of Expression 1 can be obtained.

In general, each of the aperture sizes D and d of each antenna is substantially the same as the wavelength λ of the measurement frequency. Therefore, when the relationship of Expression 1 is satisfied, each of the aperture sizes D and d tends to be smaller than the distance L. In this case, the radiation pattern of electromagnetic waves radiated from the measured antenna 3 in the Fresnel region is substantially the same as that in the Fraunhofer region. Therefore, even in the Fresnel region where the distance L between the measured antenna 3 and the measuring antenna 4 is short, antenna characteristics substantially the same as those in the Fraunhofer region where the distance L is long can be measured.

However, if the distance L is set to a value smaller than $(D+d)^2/(2\lambda)$, that is, in the Rayleigh region, the radiation pattern of electromagnetic waves radiated from the measured antenna 3 is different from that in the Fraunhofer region. Therefore, the distance L between the measured antenna 3 and the measuring antenna 4 needs to be set to a value greater than that in the Rayleigh region, smaller than that in the Fraunhofer region, and satisfying the relationship of Expression 1.

Thus, in the present embodiment, in the Fresnel region where the distance L between the measured antenna 3 and the measuring antenna 4 is small, antenna characteristics substantially the same as those in the Fraunhofer region (far field) can be measured. As a result, since antenna characteristics can be measured in the Fresnel region where the distance L between the antennas 3 and 4 is smaller than that in the Fraunhofer region, the outer dimensions of the radio anechoic container 1 can be reduced and the length of each side of the radio anechoic container 1 can be reduced to 100 cm or less. The radio anechoic container 1 can be made compact and the measurement space can be made small. Additionally, since there is no need to measure the attenuation of the radio anechoic container 1 and no need to perform arithmetic processing, such as correction, it is possible to reduce measurement time and improve workability of measurement.

Although an internal antenna for a mobile phone is used as the measured antenna 3 in the embodiment described above, a whip antenna for a mobile phone and other types of antennas may be used. Similarly, although a biconical antenna is used as the measuring antenna 4 in the embodiment described above, other types of antennas may be used.

At the same time, although the radio anechoic container 1 has a quadrangular cylindrical shape (cubic shape) in the embodiment described above, the radio anechoic container 1 may have any shape, such as a circular cylindrical shape, a polygonal cylindrical shape, or a spherical shape, as long as the radio anechoic container 1 defines a space that can accommodate the measured antenna 3 and the measuring antenna 4.

Although particular embodiments have been described, many other variations and modifications and other uses will become apparent to those skilled in the art. Therefore, the present invention is not limited by the specific disclosure herein.

What is claimed is:

1. An antenna-characteristic measuring apparatus comprising a radio anechoic container internally provided with a radio wave absorber, a measured antenna placed inside the radio anechoic container and to be subjected to measurement, and a measuring antenna positioned inside the radio anechoic container and opposite the measured antenna and configured to measure antenna characteristics of the measured antenna, 
wherein said measuring antenna is mounted movably inside the radio anechoic container for setting a distance L along a length direction between the measured antenna and the measuring antenna to satisfy the following relationship:

$$\frac{(D+d)^2}{2\lambda} \le L \le \frac{2(D+d)^2}{\lambda}$$

where D denotes aperture size of the measured antenna, d denotes aperture size of the measuring antenna, and λ denotes wavelength of a measurement frequency.

2. The apparatus of claim 1, wherein said measuring antenna is a biconical antenna with elements disposed transversely to said length direction.

3. The apparatus of claim 1, wherein said measuring antenna is movable toward and away from said measured antenna.

4. The apparatus of claim 3, further comprising a two-axis positioner for holding and rotating said measured antenna about an axis corresponding to said length direction, and about an axis perpendicular to said length direction.

5. An antenna-characteristic measuring method in which a measured antenna and a measuring antenna facing each other are placed inside a radio anechoic container internally provided with a radio wave absorber and the measuring antenna is used to measure antenna characteristics of the measured antenna, the method comprising the steps of:
setting a distance L along a length direction between the measured antenna and the measuring antenna to satisfy the following relationship:

$$\frac{(D+d)^2}{2\lambda} \le L \le \frac{2(D+d)^2}{\lambda}$$

where D denotes aperture size of the measured antenna, d denotes aperture size of the measuring antenna, and λ denotes wavelength of a measurement frequency; and
measuring, after the setting step, electromagnetic waves from the measured antenna using the measuring antenna.

6. The method of claim 5, wherein
said measured antenna is a whip antenna of an RF device, and
the aperture size D is an overall length of the whip antenna and the RF device.

7. The method of claim 5, wherein
said measured antenna is an internal antenna of an RF device, and
the aperture size D is an overall length of the RF device.

8. The method of claim 5, further comprising the step of rotating the measured antenna about an axis corresponding to said length direction.

9. The method of claim 8, further comprising the step of rotating the measured antenna about an axis perpendicular to said length direction.

10. The method of claim 5, further comprising the step of rotating the measured antenna about an axis perpendicular to said length direction.

* * * * *